United States Patent
Dawson et al.

(10) Patent No.: US 6,184,986 B1
(45) Date of Patent: *Feb. 6, 2001

(54) DEPOSITING A MATERIAL OF CONTROLLED, VARIABLE THICKNESS ACROSS A SURFACE FOR PLANARIZATION OF THAT SURFACE

(75) Inventors: Robert Dawson; Charles E. May, both of Austin, TX (US)

(73) Assignee: Advanced Micro Devices, Inc., Sunnyvale, CA (US)

( * ) Notice: Under 35 U.S.C. 154(b), the term of this patent shall be extended for 0 days.

This patent is subject to a terminal disclaimer.

(21) Appl. No.: 09/441,222

(22) Filed: Nov. 15, 1999

Related U.S. Application Data

(62) Division of application No. 09/056,024, filed on Apr. 6, 1998.

(51) Int. Cl.$^7$ ................................................ G01B 11/06

(52) U.S. Cl. ............................................ 356/381; 356/376

(58) Field of Search ................................. 356/381, 382; 438/5, 12; 118/663; 427/9, 466, 555

(56) References Cited

U.S. PATENT DOCUMENTS

| | | |
|---|---|---|
| 5,731,994 | 3/1998 | Okubu et al. . |
| 6,033,921 * | 3/2000 | Dawson et al. ............................ 438/5 |

FOREIGN PATENT DOCUMENTS

| | | |
|---|---|---|
| 0 582 724 | 2/1994 | (EP) . |
| 0 654 816 | 5/1995 | (EP) . |
| 2 308 733 | 7/1997 | (GB) . |
| 97/01186 | 1/1997 | (WO) . |

OTHER PUBLICATIONS

International Search Report, Application No. PCT/US98/2203 mailed Feb. 4, 1999.

\* cited by examiner

*Primary Examiner*—Hoa Q. Pham
(74) *Attorney, Agent, or Firm*—Kevin L. Daffer; Conley, Rose & Tayon

(57) ABSTRACT

A method is provided for obtaining a topography with a substantially planar upper surface. The profile of the upper surface of the semiconductor topography is first detected by a profile detection tool, such as a stylus profilometer. The profile detection tool creates a database to quantify the elevational variations across the upper surface of the semiconductor topography. The database is then provided to a control system of a deposition tool. The control system controls the deposition of a profile layer upon the upper surface of the semiconductor topography such that a thickness of the profile layer is a function of the elevation of the surface. In one embodiment, the control system controls a potential gradient across the semiconductor topography so as to cause more reactant species to be directed toward the more recessed regions of the topography. In another embodiment, the control system controls the opening and closing of valves disposed within a shower head above the semiconductor topography. More reactant species are allowed to pass from those valves positioned directly above the more recessed regions of the topography. The resulting upper surface of the semiconductor topography is thus planar.

9 Claims, 4 Drawing Sheets

| Location (x,y) | Elevation (z) |
|---|---|
| . | . |
| . | . |
| . | . |
| (2.2, 3.3) | 1.5 |
| (2.2, 3.4) | 1.55 |
| . | . |
| . | . |
| . | . |

DEPOSITING A MATERIAL OF CONTROLLED, VARIABLE THICKNESS ACROSS A SURFACE FOR PLANARIZATION OF THAT SURFACE

This is a Division of application Ser. No. 09/056,024, filed Apr. 6, 1998.

BACKGROUND OF THE INVENTION

1. Field of the Invention

This invention relates to the field of semiconductor processing and, more particularly, to an integrated circuit and method of making the same in which a layer of varying thickness is deposited upon a topographical surface of a semiconductor topography to compensate for elevational variations across the surface.

2. Description of Relevant Art

An integrated circuit consists of electronic devices electrically coupled by conductive trace elements, i.e., interconnect. Interconnect are patterned from conductive layers formed above the surface of a semiconductor substrate in which impurity regions have been formed. An integrated circuit can comprise multiple levels of interconnect spaced from each other by interlevel dielectric layers and electrically linked by contact structures extending through the interlevel dielectric layers. The use of multiple levels of interconnect within an integrated circuit increases the density of active devices placed upon a single monolithic substrate.

In addition to added process complexity, an increase in the number of interconnect levels leads to a corresponding increase in the elevational disparity of the resulting surface (i.e., an increase in the difference between the peaks and valleys of the resulting upper surface). For example, when a dielectric layer is chemically-vapor deposited across interconnect lines laterally spaced from each other within a single horizontal plane, numerous peaks and valleys may result in the upper surface of the dielectric layer. The chemical-vapor deposition ("CVD") process produces a relatively conformal dielectric layer across the semiconductor topography comprising the interconnect lines. In this manner, the dielectric layer climbs to a higher elevation when it crosses over an interconnect line and falls to a lower elevation in between interconnect lines.

Unfortunately, elevation disparity across the upper surface of an ensuing integrated circuit can lead to many problems. Exemplary problems include stringers arising from incomplete etching over severe steps, failure to open vias due to interlevel dielectric thickness disparity, and poor adhesion to underlying materials. Elevation disparity also causes step coverage problems of, e.g., interconnect placed over an interlevel dielectric peak and valley area as well depth-to-focus problems when patterning, e.g., interconnect upon an interlevel dielectric. Many manufacturers have undergone extensive research in methods for planarizing topographical surfaces in order to avoid the above problems. Chemical-mechanical polishing ("CMP") is a well known technique used to planarize the surfaces of layers formed during integrated circuit fabrication.

A typical CMP process involves placing a semiconductor wafer face-down on a polishing pad which is fixedly attached to a rotatable table or platen. Elevationally extending portions of the downward-directed wafer surface contact with the rotating pad. A fluid-based chemical, often referred to as a "slurry" is deposited upon the pad possibly through a nozzle such that the slurry becomes disposed at the interface between the pad and the wafer surface. The slurry initiates the polishing process by chemically reacting with the surface material being polished. The polishing process is facilitated by the rotational movement of the pad relative to the wafer (or vice versa) to remove material catalyzed by the slurry. Unfortunately, if the reaction rate of the slurry with the surface material varies across the surface, certain areas of the wafer may be removed more quickly than others. Further, a CMP polishing pad which conforms to underlying surfaces, or bows in an arcuate pattern in response to force applied thereto, may undesirably remove some portions of the wafer while leaving others behind. Thus, reaction rate variation and/or pad pressure variation can lead to the formation of recesses in the topographical surfaces being "planarized" by CMP.

It would therefore be desirable to develop a process for substantially planarizing the upper surface of a semiconductor topography. Particularly, a process is needed which would minimize the surface disparity across a layer formed during the fabrication of an integrated circuit. A planarization process which does not result in the formation of recesses in the topographical surfaces being planarized would be beneficial. Such a process could be used as a replacement of a CMP planarization step, or in some cases as a back-up planarization step in addition to CMP.

SUMMARY OF THE INVENTION

The problems identified above are, in large part, addressed by an improved method for substantially planarizing a surface having surface disparity. The profile of the upper surface of a semiconductor topography is detected in order to quantify the elevational variations across the surface and store the elevational variations in a database. A deposition tool is then used to deposit a profile layer of varying thickness across the topographical surface, wherein the thickness of the profile layer is controlled as a function of the elevation of the topographical surface, as indicated by the database. In this manner, the thickness of the profile layer is made thicker upon the more recessed regions of the topographical surface than upon the more elevated regions of the topographical surface. Thus, the profile layer compensates for elevational variations, resulting in a substantially planar upper surface. Advantageously, the present planarization method may be used to replace CMP planarization techniques or to compensate for recesses formed in a surface as a result of CMP.

In one embodiment, a profile detection tool (e.g., a stylus profilometer, an interferometer, a scanning capacitance microscope, or a Thermowave™ microscope) is used to detect the elevational variations across a topographical surface. A database is created to quantify the elevational variations across the topographical surface. The database comprises a plurality of x, y, and z coordinates, wherein the x and y coordinates indicate a location across the surface of the wafer, and wherein the z coordinate indicates the elevation of the upper surface of the wafer at that location. The database is provided to a control system of a deposition tool, e.g., a plasma-enhanced CVD ("PECVD") deposition tool. A semiconductor topography comprising the topographical surface is positioned within a chamber of the deposition tool. A potential gradient representative of the elevational variations of the topographical surface, as indicated by the control system, is formed across the surface. A profile layer is then deposited upon the topographical surface. The potential present at a particular location on the surface dictates the amount of material deposited at that position. Thus, the potential gradient causes a varying thickness of the profile layer to be deposited across the topographical surface. For example, the potential gradient may be used to control where excited atoms sourced from a plasma become adsorbed upon the surface during PECVD. In this manner, more excited atoms can be adsorbed upon the valleys of the topographical surface than upon the peaks. The excited atoms thus react to form a material that is thicker over the more recessed regions of the topographical surface than over the more elevated regions of the topographical surface. The upper surface of the resulting semiconductor topography is thus substantially free of surface disparity.

In another embodiment, elevational variations across a topographical surface are used to dictate the opening and closing of piezo valves disposed within a conduit leading to shower head openings. The piezo valves control the flow of reactant species through the openings into a PECVD chamber in which the semiconductor topography comprising the topographical surface is placed. A database created from measurements taken by a profile detection tool of the topographical surface is provided to a control system which regulates the piezo valves. A larger quantity of reactant species is allowed to pass from those openings positioned directly above the more recessed regions of the topographical surface. Since a larger quantity of reactant species is directed toward the valleys of the topographical surface, more material becomes deposited there than upon the peaks of the surface. In this manner, a profile layer is deposited across the topographical surface whose thickness is controlled as a function of the elevation of the surface. Thus, variations in the thickness of the profile layer deposited across the topographical surface are used to compensate for elevational disparity across the surface. The upper surface of the resulting semiconductor topography is thus substantially planar.

BRIEF DESCRIPTION OF THE DRAWINGS

Other objects and advantages of the invention will become apparent upon reading the following detailed description and upon reference to the accompanying drawings in which.

Figure 1:
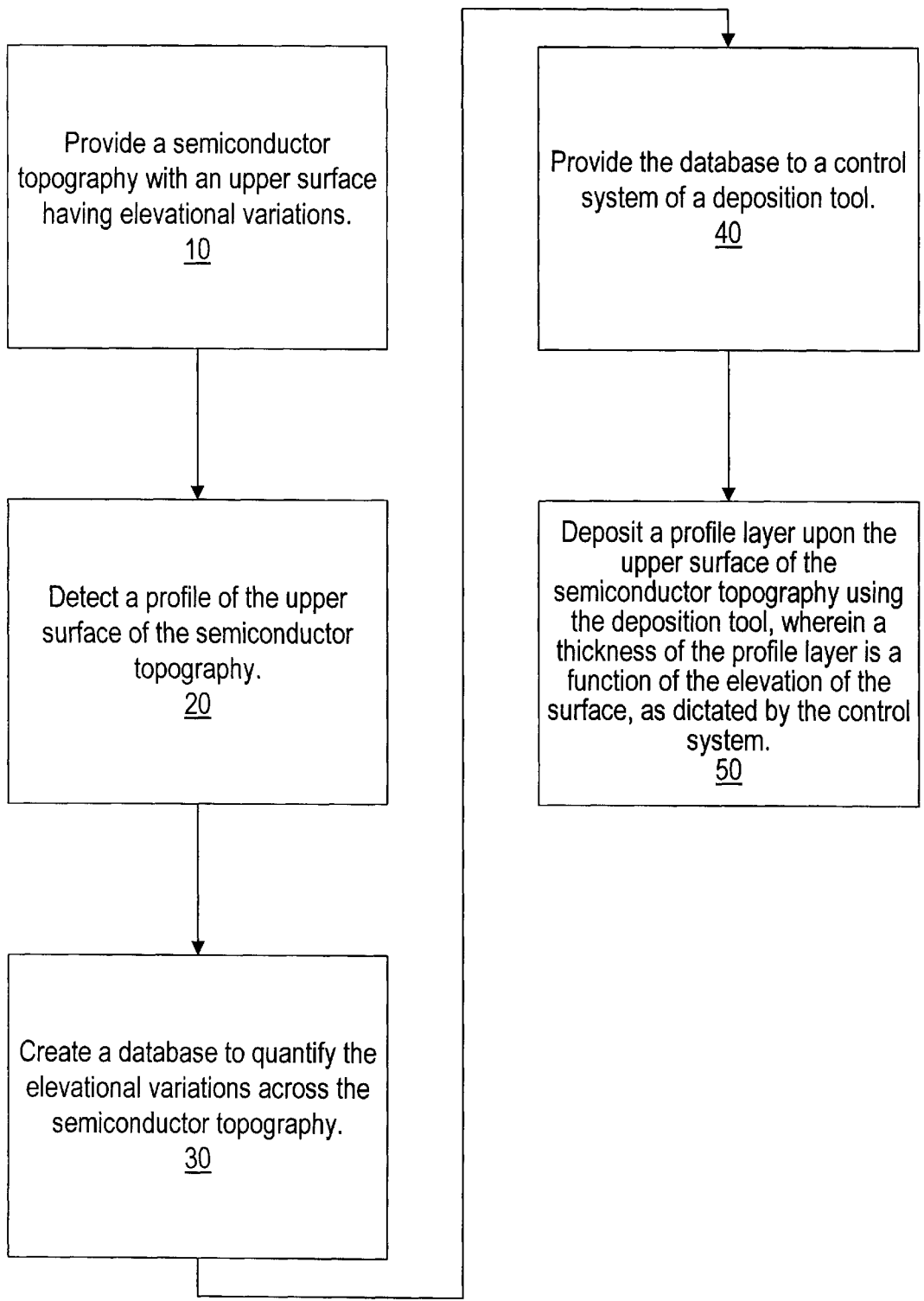
FIG. 1 is a flow chart describing a method for planarizing an upper surface of a semiconductor topography.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning now to the figures, FIG. 1 shows a flowchart describing a process for obtaining a semiconductor topography with a substantially planar upper surface. As shown in block 10, a semiconductor topography is first provided with an upper surface having elevational variations. Thereafter, as shown in block 20, a profile of the upper surface of the semiconductor topography is detected using a tool that can trace the elevational changes of the upper surface. Turning to block 30, a database is then created to quantify these elevational variations across the upper surface of the semiconductor topography as a function of location. As shown in block 40, the created database is then provided to a deposition tool, e.g., a PECVD tool. Turning to block 50, the deposition tool is programmed to deposit a profile layer upon the upper surface of the semiconductor topography, wherein a thickness of the profile layer is a function of the elevation of the topography. After deposition, an upper surface of the resulting topography is substantially planar.

Figure 2:
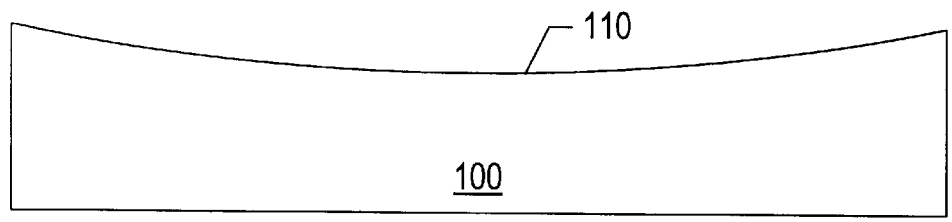
FIG. 2 is a partial cross-sectional view of a semiconductor topography showing a recess formed in the upper surface of the semiconductor topography.
Figure 3:
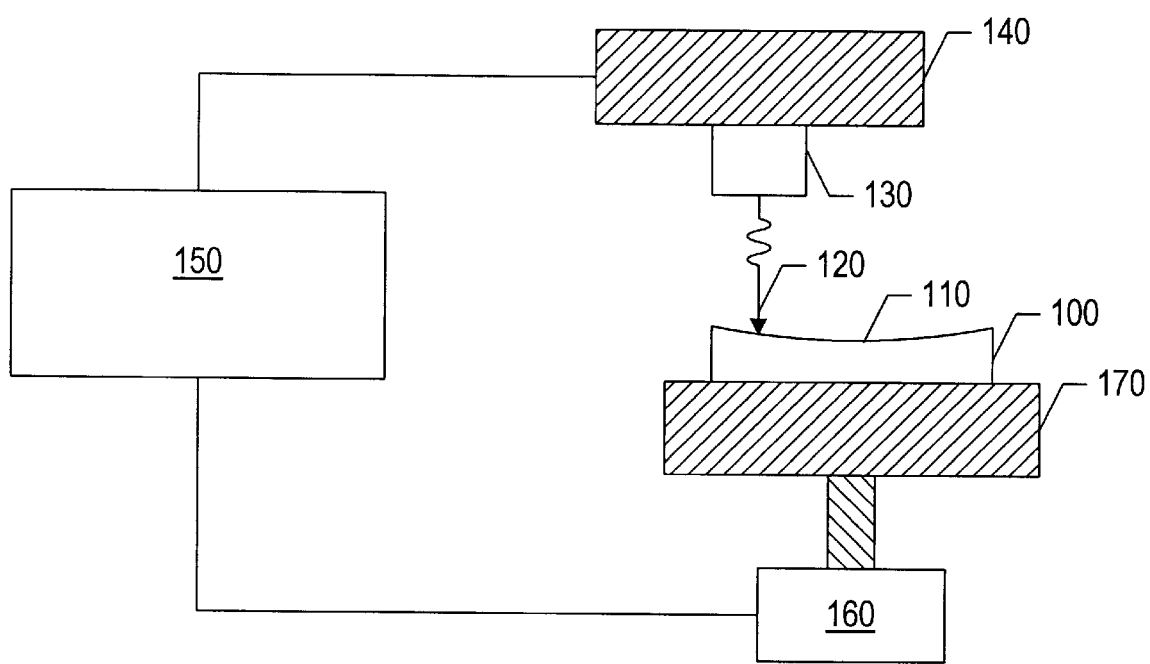
FIG. 3 is a side plan view of a stylus profilometer used to detect a profile of the upper surface of the semiconductor topography.

Turning now to FIG. 2, a cross-sectional view of semiconductor topography 100 is shown. Upper surface 110 of semiconductor topography 100 is shown to have elevational variations. Upper surface 110 is recessed as a result of, e.g., using the CMP process to planarize the surface. In alternative embodiments, upper surface 110 may also have other types of elevational variations. FIG. 3 depicts a stylus profilometer which may be used to detect the profile (elevational variations) of upper surface 10 of semiconductor topography 100. The stylus profilometer includes a profilometer tip 120 attached to supporting base 130, the supporting base being attached to supporting structure 140. Profilometer tip 120 is free to move in the vertical direction, enabling it to detect elevational changes. The elevational changes are recorded by electronic control unit 150 which is attached to supporting structure 140. Electronic control unit 150 is also connected to positioning unit 160. Positioning unit 160 is able to control the motion of stage 170 in the x-y plane. Semiconductor topography 100 may be placed upon stage 170, and as positioning unit 160 moves stage 170 in the horizontal plane, profilometer tip 120 detects the elevational variations in the upper surface 110 of topography 100. The elevational variations detected by profilometer tip 120 are recorded by electronic control unit 150 as a function of the horizontal position of stage 170. The location of stage 170 is given in x and y coordinates. It is to be understood that other profile detection tools, e.g., an interferometer, a scanning capacitance microscope, and a Thermowave™ microscope, may be used as well.

Figures 4, 5:
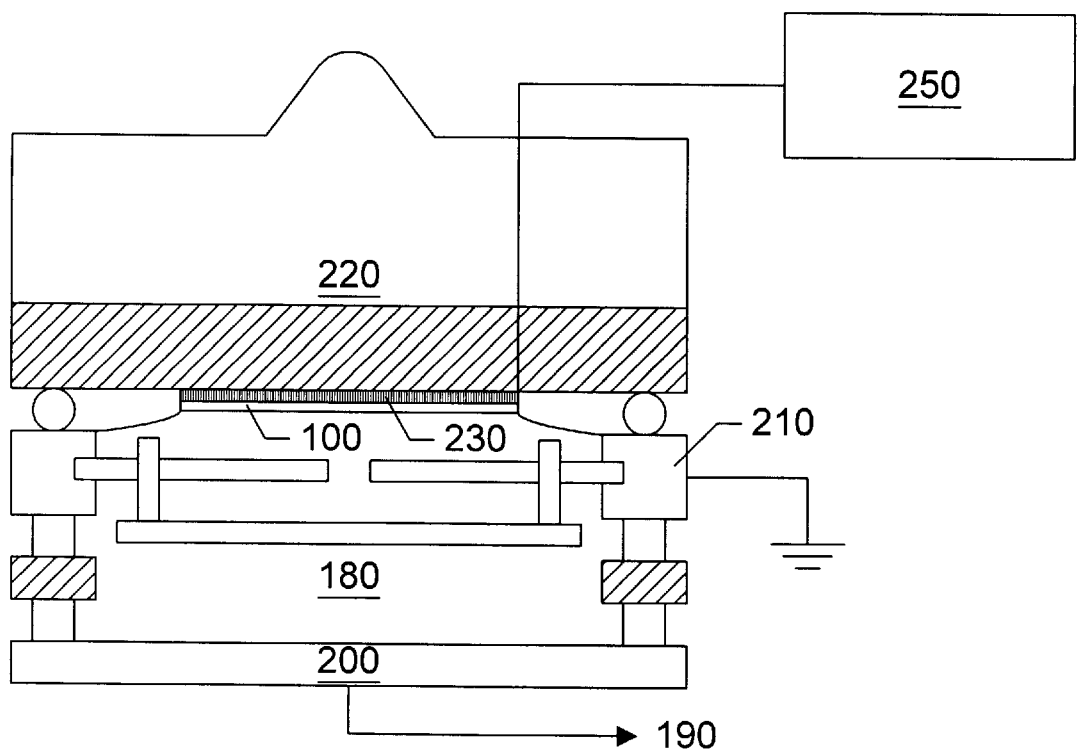
FIG. 4 is a table having an exemplary list of locations on the upper surface of the semiconductor topography and the corresponding elevation of the upper surface at each location.
FIG. 5 is a side plan view of the PECVD tool used to deposit a profile layer upon the upper surface of the semiconductor topography.

Turning now to FIG. 4, a table of exemplary data collected by electronic control unit 150 is illustrated. The elevation (z) detected by profilometer tip 120 is shown in the second column of the table. The location of positioning unit 160 corresponding to each vertical position of profilometer tip 120 is recorded by control unit 150. The location of positioning unit 160 is shown in x and y coordinates in the first column of the table.

Turning now to FIG. 5, a PECVD deposition tool is shown. Prior to the deposition of a profile layer across the upper surface of semiconductor topography 100, the topography is positioned within a reaction chamber 180. Vapor phase compounds that contain the required reactant species to form the desired material across topography 100 are passed into reaction chamber 180. An rf power 190 with a frequency of approximately 40 kHz to 40 MHz is applied to water-cooled rf electrode 200 while electrode 210 is maintained at ground. The applied rf power establishes a plasma in gas chamber 180. The establishment of a plasma enables the chemical-vapor deposition to be performed at lower than typical deposition temperatures (approximately 200° C. to 400° C). During the deposition, heater 220 maintains reaction chamber 180 and the reactant species at a constant temperature. According to one embodiment, a voltage bias film 230 is placed against the backside of semiconductor topography 100. Voltage bias film 230 is connected to electronic control unit 250 which controls the voltage bias across the surface of film 230. Electronic control unit 250 receives input from electronic control unit 150 (see FIG. 4) that controls the profilometer tool. A database created from the elevational variations detected by the profilometer tool are exchanged between the two electronic control units. The resultant voltage bias across the surface of voltage bias film 230 controls where upon the surface of topography 100 the reactant species accumulate. Specifically, film 230 can be biased at dissimilar magnitudes within corresponding distinct regions upon the film. For example, a relatively small first region (less than, e.g., several microns) can be positively biased more so than another small, second region laterally adjacent the first region. The amount of biasing dictates the quantity of ions directed upon the frontside surface of topography 100 from chamber 180. Thus, the bias at isolated regions of film 230 translates from the backside surface to the frontside surface in a direction substantially perpendicular to that surface. This ensures the localized, biased areas of film 230 align with topography 100. In this manner, the amount of material directionally introduced upon topography 100 can vary depending on where on the underlying film bias is applied, and the amount of that bias. The the thickness of the profile layer deposited across the surface of topography 100 can therefore be controlled based on that bias location and amount so as to compensate for elevational variations upon topography 100. The end result is a planar upper surface for semiconductor topography 100.

Figure 6:
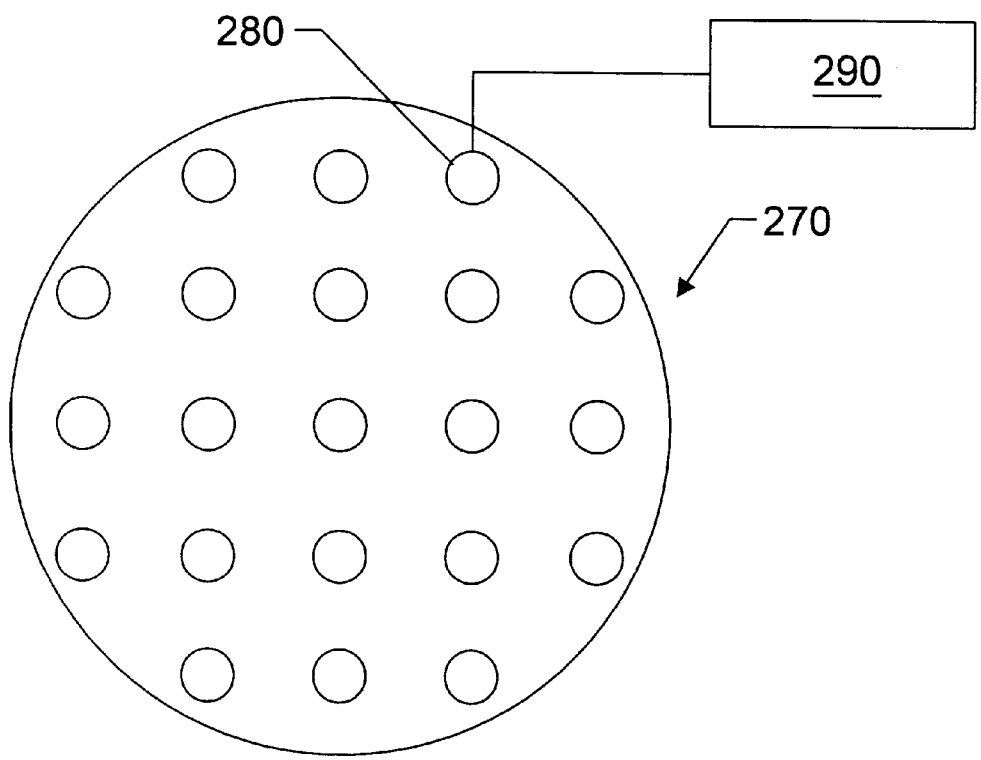
FIG. 6 is a plan view of the base of a shower head from which reactant species pass into a chamber of the PECVD tool.

FIG. 6 depicts a plan view of a shower head 270 which may be used for the deposition of a profile layer across a non-planar surface of a semiconductor topography, according to another embodiment. Shower head 270 may be positioned above the semiconductor topography within a reaction chamber of a PECVD tool similar to the one shown in FIG. 5. Shower head 270 includes a plurality of piezo valves 280 through which the gas comprising the reactant species may pass into the reaction chamber. Each of the piezo valves 280 communicates with an electronic control unit 290. Electronic control unit 290 receives input from electronic control unit 150 (see FIG. 4) that controls the profilometer tool. Based on the x, y, and z coordinates of the database stored by electronic control unit 150, electronic control unit 290 determines which piezo valves 280 to open and which to close. Each piezo valve 280 is positioned at an x and y coordinate corresponding to an x and y coordinate of the semiconductor topography disposed below shower head 270.

Electronic control unit 290 controls the opening and closing of piezo valves 280 by adjusting the electronic voltage applied to each valve. Specifically, control unit 290 controls which valve within the array of valves is to be opened. Also it determines the amount by which a selected valve is opened. In order to control the thickness of the profile layer deposited across the semiconductor topography, electronic control unit 290 causes those valves positioned directly above the more recessed regions of the topography to be in the open position for the longest duration of time. In this manner, more reactant species are permitted to pass into the reaction chamber through those valves. Because the pressure of the PECVD chamber is relatively low, the reactant species experience relatively few collisions, and follow straight line trajectories directly from shower head 270 and to the underlying semiconductor topography. In this manner, the opening and closing of valves can control localized areas of deposition by virtue of material flowing through those values or absence thereof. For example, valves can remain open more so directly above recessed regions of the semiconductor topography to fill those regions. A resulting surface of the profile layer topography can therefore be made substantially planar.

Figure 7:
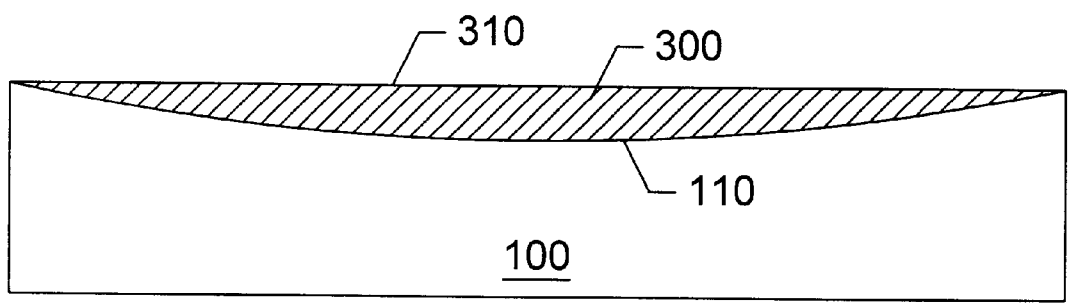
FIG. 7 is a partial cross-sectional view of a semiconductor topography showing a deposited profile layer of varying thickness arranged upon the upper surface of the semiconductor topography, wherein the surface of the resulting semiconductor topography is substantially planar.

Turning now to FIG. 7, semiconductor topography 100 is shown with deposited profile layer 300 formed according to either of the-previously described embodiments. Profile layer 300 has a variable thickness across the surface 110 of semiconductor topography 100 in which the thickness is thinner over higher elevations of surface 110 and thicker over lower elevations of surface 110. The thickness of profile layer 300 therefore compensates for elevational variations across surface 110 of semiconductor topography 100. As a result, upper surface 310 of profile layer 300 is substantially planar.

It will be appreciated to those skilled in the art having the benefit of this disclosure that this invention is believed to be capable of producing a semiconductor topography with a substantially upper surface. Furthermore, it is also to be understood that the form of the invention shown and described is to be taken as exemplary, presently preferred embodiments. Various modifications and changes may be made without departing from the spirit and scope of the invention as set forth in the claims. It is intended that the following claims be interpreted to embrace all such modifications and changes.

What is claimed is:

1. A system for forming a planar upper surface of a semiconductor topography, comprising:
   a profile detection tool for detecting a profile of a topographical surface of a semiconductor topography, wherein said topographical surface comprises elevational variations, and wherein said profile detection tool is configured to create a database which quantifies said elevational variations across said upper surface of said semiconductor topography; and
   a deposition tool configured to receive said database, wherein said deposition tool is further configured to deposit a varying thickness of a profile layer across said topographical surface of said semiconductor topography as a function of an elevation of said surface.

2. The system of claim 1, wherein said profile detection tool comprises a tool selected from the group consisting of a profilometer, an interferometer, a scanning capacitance microscope, and a Thermowave™ microscope.

3. The system of claim 1, wherein said database comprises a plurality of x, y, and z coordinates, and wherein said x and said y coordinates represent various locations upon said topographical surface of said semiconductor topography, and wherein said z coordinate represents corresponding elevations of said various locations.

4. The system of claim 1, wherein said deposition tool comprises a PECVD tool.

5. The system of claim 4, wherein said PECVD tool comprises a control system for receiving said database.

6. The system of claim 5, wherein said PECVD tool comprises a chamber, and wherein said semiconductor topography is positioned within said chamber of said PECVD tool.

7. The system of claim 6, wherein said PECVD tool further comprises a conductive tape arranged adjacent said topographical surface of said semiconductor topography.

8. The system of claim 7, wherein said control system is configured to form a potential gradient representative of said elevational variations of said topographical surface across said conductive tape to control where reactant species generated by said PECVD tool are directed onto said topographical surface.

9. The system of claim 6, wherein said PECVD tool further comprises a shower head positioned above said semiconductor topography, said shower head comprising piezo valves through which reactant species pass into said chamber, and wherein said control system is configured to regulate opening and closing of said valves to control where said reactant species are directed onto said topographical surface.

* * * * *